(12) United States Patent
Wu et al.

(10) Patent No.: US 7,763,902 B2
(45) Date of Patent: Jul. 27, 2010

(54) LIGHT EMITTING DIODE CHIP

(75) Inventors: Liang-Wen Wu, Tao-Yung Hsien (TW); Fen-Ren Chien, Tao-Yung Hsien (TW)

(73) Assignee: Formosa Epitaxy Incorporation, Tao-Yung Hsien (TW)

( * ) Notice: Subject to any disclaimer, the term of this patent is extended or adjusted under 35 U.S.C. 154(b) by 0 days.

(21) Appl. No.: 11/536,694

(22) Filed: Sep. 29, 2006

(65) Prior Publication Data
US 2007/0090390 A1 Apr. 26, 2007

(30) Foreign Application Priority Data
Oct. 20, 2005 (TW) .............................. 94136676 A

(51) Int. Cl.
*H01L 33/04* (2010.01)
(52) U.S. Cl. .................. 257/96; 257/103; 257/190; 257/E33.03; 257/E33.047
(58) Field of Classification Search ............ 257/E33.023, 257/E33.026–E33.034, E33.047, E33.049, 257/96, 103, 190
See application file for complete search history.

(56) References Cited

U.S. PATENT DOCUMENTS

| | | | |
|---|---|---|---|
| 5,577,350 A | 11/1996 | Brisbin et al. | |
| 6,515,308 B1 * | 2/2003 | Kneissl et al. | 257/86 |
| 6,526,082 B1 | 2/2003 | Corzine et al. | |
| 6,800,876 B2 * | 10/2004 | Edmond et al. | 257/94 |
| 2003/0205718 A1 | 11/2003 | Koike et al. | |
| 2004/0012014 A1 * | 1/2004 | Yamanaka et al. | 257/13 |

FOREIGN PATENT DOCUMENTS

WO 02093658 11/2002

OTHER PUBLICATIONS

F. C. Chang et al. "Characteristics of p-type GaN Films Doped with Isoelectronic Indium Atoms." Chinese Journal of Physics, Dec. 2002, vol. 40, No. 6. pp. 637-643. The Physical Society of the Republic of China.

(Continued)

*Primary Examiner*—Minh-Loan T Tran
*Assistant Examiner*—W. Wendy Kuo
(74) *Attorney, Agent, or Firm*—Jianq Chyun IP Office

(57) ABSTRACT

A LED chip including a substrate, a first type doped semiconductor layer, a second type doped semiconductor layer, a light emitting layer, at least an Indium-doped $Al_xGa_{1-x}N$ based material layer ($0 \leq x < 1$) and at least a tunneling junction layer is provided. The first type doped semiconductor layer is disposed on the substrate, and the light emitting layer is disposed between the first type doped semiconductor layer and the second type doped semiconductor layer. The Indium-doped $Al_xGa_{1-x}N$ based material layer is disposed on at least one surface of the light emitting layer, and the tunneling junction layer is disposed between the Indium-doped $Al_xGa_{1-x}N$ based material layer and the first type doped semiconductor layer and/or disposed between the Indium-doped $Al_xGa_{1-x}N$ based material layer and the second type doped semiconductor layer, wherein the Indium-doped $Al_xGa_{1-x}N$ based material layer and the tunneling junction layer are disposed on the same side of the light emitting layer.

20 Claims, 4 Drawing Sheets

OTHER PUBLICATIONS

H. M. Chung et al "Electrical characterization of Isoelectronic In-doping effects in GaN films grown by metalorganic vapor phase epitaxy." Applied Physics Letters. Feb. 14, 2000. vol. 76 No. 7. pp. 897-899. American Institute of physics.

Cheng-Huang Kuo et al. "GaN-Based Light Emitting Diodes with Si-Doped $In_{0.23}Gn_{0.77}N$/GaN Short Period Superlattice Current Spreading Layer." Jpn. J. Appl. Phys. vol. 42(2003). pp. 2270-2272. Part 1. No. 4B. Apr. 2003. The Japan Society of Applied Physics.

C. K. Shu et al. "Isoelectronic In-doping effect in GaN films grown by metalorganic chemical vapor deposition." Applied Physics Letters. Aug. 3, 1998. vol. 73. No. 5. pp. 641-643. American Institute of Physics.

\* cited by examiner

LIGHT EMITTING DIODE CHIP

CROSS-REFERENCE TO RELATED APPLICATION

This application claims the priority benefit of Taiwan application serial no. 94136676, filed Oct. 20, 2005. All disclosure of the Taiwan application is incorporated herein by reference.

BACKGROUND OF THE INVENTION

1. Field of Invention

The present invention relates to a semiconductor device, and more particularly, to a light emitting diode (LED) chip.

2. Description of Related Art

LED chips are a kind of semiconductor device fabricated by chemical elements of group III-V, such as gallium phosphide (GaP), gallium arsenide (GaAs) and gallium nitride (GaN). By applying current to the compound semiconductors, and through the recombination of electrons and holes, the electric energy is converted into light energy and released in photon form to achieve light radiation. The radiation of a LED is of a cold mechanism, but not through heat, therefore the lifetime of LEDs can be over a hundred thousand hours and no idling time is required. In addition, LEDs have such advantages as fast response speed (about 10-9 second), small volume, low power consumption, low pollution (no mercury), high reliability and adaptation to mass production. Hence, LEDs have wide applications, such as light sources of scanners, backlight of liquid crystal displays, outdoor display boards, or vehicle lightings.

The conventional LED mainly comprises a light emitting layer, an n-type doped semiconductor layer, and a p-type doped semiconductor layer. The n-type doped semiconductor layer and the p-type doped semiconductor layer are disposed on two sides of the light emitting layer, respectively. Generally, there is lattice mismatch between each of the above material layers, which may cause the quality of the epitaxy to deteriorate due to the relatively large stress generated during the process of epitaxy. Furthermore, since the p-type doped semiconductor layer has a higher resistance value, a larger voltage drop may be occurred at the joint between the p-type doped semiconductor layer and the light emitting layer, thus a higher operation voltage is required for the LED.

SUMMARY OF THE INVENTION

Accordingly, the present invention is to provide a light emitting diode (LED) chip having a low operation voltage and a flat surface.

The present invention is to provide an LED chip having a low leakage current.

As embodied and broadly described herein, the present invention provides an LED chip including a substrate, a first type doped semiconductor layer, a second type doped semiconductor layer, a light emitting layer, at least an Indium-doped $Al_xGa_{1-x}N$ based material layer ($0 \leq x < 1$), at least a tunneling junction layer, a first electrode, and a second electrode. The first type doped semiconductor layer is disposed on the substrate, and the second type doped semiconductor layer is disposed over the first type doped semiconductor layer, and the light emitting layer is disposed between the first type doped semiconductor layer and the second type doped semiconductor layer. The Indium-doped $Al_xGa_{1-x}N$ based material layer is disposed on at least one surface of the light emitting layer, and the tunneling junction layer is disposed between the Indium-doped $Al_xGa_{1-x}N$ $Al_xGa_{1-x}N$ based material layer and the first type doped semiconductor layer and/or disposed between the Indium-doped $Al_xGa_{1-x}N$ based material layer and the second type doped semiconductor layer. The Indium-doped $Al_xGa_{1-x}N$ based material layer and the tunneling junction layer are disposed on the same side of the light emitting layer. The first electrode is disposed on the first type doped semiconductor layer, and the second electrode is disposed on the second type doped semiconductor layer.

As embodied and broadly described herein, the present invention further provides an LED chip including a substrate, a first type doped semiconductor layer, a second type doped semiconductor layer, a light emitting layer, at least an undoped $Al_xGa_{1-x}N$ based material layer ($0 \leq x < 1$), at least a tunneling junction layer, a first electrode, and a second electrode. The first type doped semiconductor layer is disposed on the substrate, and the second type doped semiconductor layer is disposed over the first type doped semiconductor layer. The light emitting layer is disposed between the first type doped semiconductor layer and the second type doped semiconductor layer. The undoped $Al_xGa_{1-x}N$ based material layer is disposed on at least one surface of the light emitting layer, and the tunneling junction layer is disposed between the undoped $Al_xGa_{1-x}N$ based material layer and the first type doped semiconductor layer and/or disposed between the undoped $Al_xGa_{1-x}N$ based material layer and the second type doped semiconductor layer, wherein the undoped $Al_xGa_{1-x}N$ based material layer and the tunneling junction layer are disposed on the same side of the light emitting layer. The first electrode is disposed on the first type semiconductor layer, and the second electrode is disposed on the second type semiconductor layer.

In an embodiment of the present invention, the band-gap of the above tunneling junction layer is greater than that of the light emitting layer.

In an embodiment of the present invention, the above tunneling junction layer comprises a first type $Al_xGa_{1-x}N$ based material layer and a second type $Al_xGa_{1-x}N$ based material layer, wherein the second type $Al_xGa_{1-x}N$ based material layer is disposed on one surface of the first type $Al_xGa_{1-x}N$ based material layer.

In an embodiment of the present invention, the above first type $Al_xGa_{1-x}N$ based material layer can be Silicon-doped, Indium-doped, or the combination thereof, and the second type $Al_xGa_{1-x}N$ based material layer can be Magnesium-doped, Indium-doped, or the combination thereof.

In an embodiment of the present invention, the above Indium-doped $Al_xGa_{1-x}N$ based material layer/undoped $Al_xGa_{1-x}N$ based material layer are disposed on the upper surface of the light emitting layer, and the second type $Al_xGa_{1-x}N$ based material layer is disposed between the Indium-doped $Al_xGa_{1-x}N$ based material layer/undoped $Al_xGa_{1-x}N$ based material layer and the first type $Al_xGa_{1-x}N$ based material layer.

In an embodiment of the present invention, the above Indium-doped $Al_xGa_{1-x}N$ based material layer/undoped $Al_xGa_{1-x}N$ based material layer are disposed on the lower surface of the light emitting layer, and the first type $Al_xGa_{1-x}N$ based material layer is disposed between the Indium-doped $Al_xGa_{1-x}N$ based material layer/undoped $Al_xGa_{1-x}N$ based material layer and the second type $Al_xGa_{1-x}N$ based material layer.

In an embodiment of the present invention, the above first type $Al_xGa_{1-x}N$ based material layer can be Magnesium-doped, Indium-doped, or the combination thereof, and the second type $Al_xGa_{1-x}N$ based material layer can be Silicon-doped, Indium-doped, or the combination thereof.

In an embodiment of the present invention, the above Indium-doped $Al_xGa_{1-x}N$ based material layer/undoped $Al_xGa_{1-x}N$ based material layer are disposed on the upper surface of the light emitting layer, and the second type $Al_xGa_{1-x}N$ based material layer is disposed between the Indium-doped $Al_xGa_{1-x}N$ based material layer/undoped $Al_xGa_{1-x}N$ based material layer and the first type $Al_xGa_{1-x}N$ based material layer.

In an embodiment of the present invention, the above Indium-doped $Al_xGa_{1-x}N$ based material layer/undoped $Al_xGa_{1-x}N$ based material layer are disposed on the lower surface of the light emitting layer, and the first type $Al_xGa_{1-x}N$ based material layer is disposed between the Indium-doped $Al_xGa_{1-x}N$ based material layer/undoped $Al_xGa_{1-x}N$ based material layer and the second type $Al_xGa_{1-x}N$ based material layer.

In an embodiment of the present invention, the above first type doped semiconductor layer comprises a buffer layer, a nucleation layer, and a first type contact layer. The buffer layer is disposed on the substrate, and the nucleation layer is disposed on the buffer layer, and the first type contact layer is disposed on the nucleation layer.

In an embodiment of the present invention, the above second type doped semiconductor layer comprises a second type contact layer.

In summary, since the tunneling junction layer can be used for effectively reducing the voltage drop between the first/second type doped semiconductor layer and the light emitting layer, thus the LED of the present invention has a low operation voltage. Additionally, the Indium-doped $Al_xGa_{1-x}N$ based material layer provides the LED chip with a more planar surface, and the undoped $Al_xGa_{1-x}N$ based material layer provides the LED chip with a lower leakage current. Therefore, the advantages effectively upgrade the quality of the LED chip of the present invention.

In order to the make the aforementioned and other objects, features and advantages of the present invention more comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The First Embodiment

Figure 1:
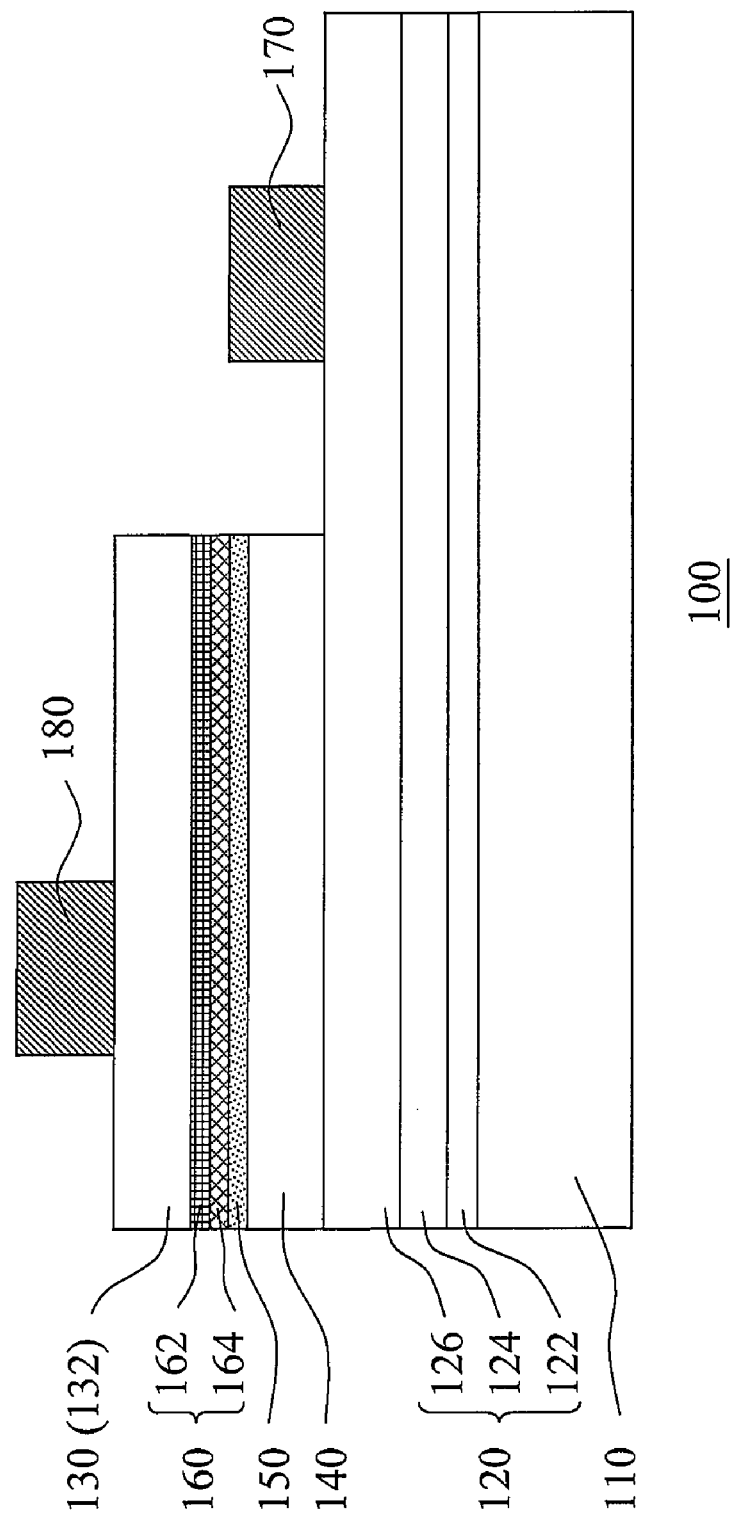
FIG. 1 is a cross-sectional schematic view of an LED chip according to a first embodiment of the present invention.

FIG. 1 is a cross-sectional schematic view of an LED chip according to a first embodiment of the present invention. Referring to FIG. 1, an LED chip 100 of the present invention comprises a chip 110, a first type doped semiconductor layer 120, a second type doped semiconductor layer 130, a light emitting layer 140, an Indium-doped $Al_xGa_{1-x}N$ based material layer ($0 \leq x < 1$) 150, a tunneling junction layer 160, a first electrode 170, and a second electrode 180. The first type doped semiconductor layer 120 is disposed on the substrate 110, and the second type doped semiconductor layer 130 is disposed above the first type doped semiconductor layer 110. The light emitting layer 140 is disposed between the first type doped semiconductor layer 120 and the second type doped semiconductor layer 130. In addition, the first electrode 170 is disposed on the first type doped semiconductor layer 110, and the second electrode 180 is disposed on the second type doped semiconductor layer 130. When a clockwise current is applied to the first electrode 170 and the second electrode 180, the electrons and the holes are transmitted into the light emitting layer 140 for combination via the first type doped semiconductor layer 120 and the second type doped semiconductor layer 130, and the energy is released in the form of light, thereby emitting the light.

In this embodiment, the Indium-doped $Al_xGa_{1-x}N$ based material layer 150 is disposed on the upper surface of the light emitting layer 140. The Indium-doped $Al_xGa_{1-x}N$ based material layer 150 is disposed in the present invention to relieve the lattice mismatch between the material of the second type doped semiconductor layer 130 and that of the light emitting layer 140, so as to reduce the stress generated by the LED chip 100 during the process of epitaxy. Also, since the dopant In has a superior surface migration capability, the LED chip 100 accordingly has a more planar surface. More particularly, since the atomic radius of In is larger than that of Ga, the dopant In can reduce the vacancy density of the element N, so as to promote the proportion of V/III during the process of epitaxy, thus improving the dislocation defects within the LED chip 100.

Again referring to FIG. 1, in this embodiment, the tunneling junction layer 160 is disposed between the Indium-doped $Al_xGa_{1-x}N$ based material layer 150 and the second type doped semiconductor layer 130, so as to reduce the voltage drop between the second type doped semiconductor layer 130 and the light emitting layer 140, thus the LED chip 100 of the present invention has a lower operation voltage. Furthermore, when the band-gap of the tunneling junction layer 160 is greater than that of the light emitting layer 140, the LED chip 100 has a preferred light emitting property.

Accordingly, the tunneling junction layer 160 comprises a first type $Al_xGa_{1-x}N$ based material layer ($0 \leq x < 1$) 162 and a second type $Al_xGa_{1-x}N$ based material layer ($0 \leq x < 1$) 164. In this embodiment, the second type $Al_xGa_{1-x}N$ based material layer 164 is disposed between the Indium-doped $Al_xGa_{1-x}N$ based material layer 150 and the first type $Al_xGa_{1-x}N$ based material layer 162. In addition, the first type $Al_xGa_{1-x}N$ based material layer 162 can be n-type $Al_xGa_{1-x}N$ based material layer, and the second type $Al_xGa_{1-x}N$ based material layer 164 can be p-type $Al_xGa_{1-x}N$ based material layer (thus, the first type doped semiconductor layer 120 and the second type doped semiconductor layer 130 can be n-type $Al_xGa_{1-x}N$ based material layer and p-type $Al_xGa_{1-x}N$ based material layer, respectively).

In order to further reduce the operation voltage of the LED chip 100, the first type $Al_xGa_{1-x}N$ based material layer 162 can be Silicon-doped, Indium-doped, or the combination thereof, and the second type $Al_xGa_{1-x}N$ based material layer 164 can be Magnesium-doped, Indium-doped, or the combination thereof in the present invention. More particularly, when the first type $Al_xGa_{1-x}N$ based material layer 162 is both Silicon-doped and Indium-doped, and the second type $Al_xGa_{1-x}N$ based material layer 164 is both Magnesium-doped and Indium-doped, the LED chip 100 can obtain an even lower operation voltage.

Furthermore, the above Indium-doped $Al_xGa_{1-x}N$ based material layer 150, the first type $Al_xGa_{1-x}N$ based material layer 162, and the second type $Al_xGa_{1-x}N$ based material layer 164 are formed through, for example, Metal Organic Chemical Vapor Deposition (MOCVD), with a thickness preferably between 0.5 nm and 20 nm, and a preferred growth temperature between 800° C. and 1200° C.

The materials and structures of each thin film layer and the substrate of the above LED chip 100 are described below respectively.

The material of the substrate 110 comprises Sapphire mono crystal, silicon carbide (6H—SiC or 4H—SiC), Si, ZnO, GaAs, $MgAl_2O_4$, or other single crystal oxides with other lattice constant approximately to the nitride semiconductor, and the configuration of the material of the substrate 110 is, for example, C-Plane, E-Plane, or A-plane.

Again referring to FIG. 1, the first type doped semiconductor layer 120 comprises a buffer layer 122, a nucleation layer 124, and a first type contact layer 126. The buffer layer 122 disposed on the substrate 110 is made of, for example, $Al_aGa_bIn_{1-a-b}N$, ($0 \leq a$, $b<1$, $a+b \leq 1$). The nucleation layer 124 is disposed on the buffer layer 122, mainly for providing a faster subsequent epitaxy and enabling a more uniform lattice arrangement of the expitaxy. The first type contact layer 126 is disposed on the nucleation layer 124.

Accordingly, the second type doped semiconductor layer 130 comprises a second type contact layer 132. In this embodiment, the first type contact layer 126 is an n-type contact layer, and the second type contact layer 132 is a p-type contact layer, and the above contact layers are made of, for example, $Al_xGa_{1-x}N$ based material ($0 \leq x<1$), and the properties of the contact layers can be adjusted with different doped impurity ions and concentrations. Furthermore, the light emitting layer 140 is constructed as a structure of multiple quantum wells made of $In_aGa_{1-a}N$ ($0 \leq a<1$), and emits light of different wavelengths depending on the different proportions of the elements In and Ga.

It is to be mentioned that, to improve the electrical properties of the LED chip 100, the first type doped semiconductor layer 120 further comprises a first type cladding layer (not shown) disposed on the first type contact layer 126. The second type doped semiconductor layer 130 further comprises a second type cladding layer (not shown) disposed between the second contact layer 132 and the light emitting layer 140. In addition, the tunneling junction layer 160 of this embodiment also has the property of a cladding layer, and thus the LED chip 100 can have preferred electrical properties without the second type cladding layer.

It is to be mentioned that, an undoped $Al_xGa_{1-x}N$ based material layer ($0 \leq x<1$) can be used to replace the Indium-doped $Al_xGa_{1-x}N$ based material layer 150 according to the present invention. As such, the leakage current of the LED 100 can be significantly reduced in the present invention, so as to provide the LED 100 with preferred electrical properties. It is to be mentioned that, the undoped $Al_xGa_{1-x}N$ based material layer is formed through for example, Metal-Organic Chemical Vapor Deposition (MOCVD), with a thickness preferably between 0.5 nm and 20 nm, and a preferred growth temperature between 800° C. and 1200° C.

Additionally, the Indium-doped $Al_xGa_{1-x}N$ based material layer 150 and the tunneling junction layer 160 are by no means limited to be located between the second type doped semiconductor layer 130 and the light emitting layer 140 according to the present invention. The LEDs with other structures in the present invention are illustrated below through other embodiments with reference to the drawings.

The Second Embodiment

Figure 2:
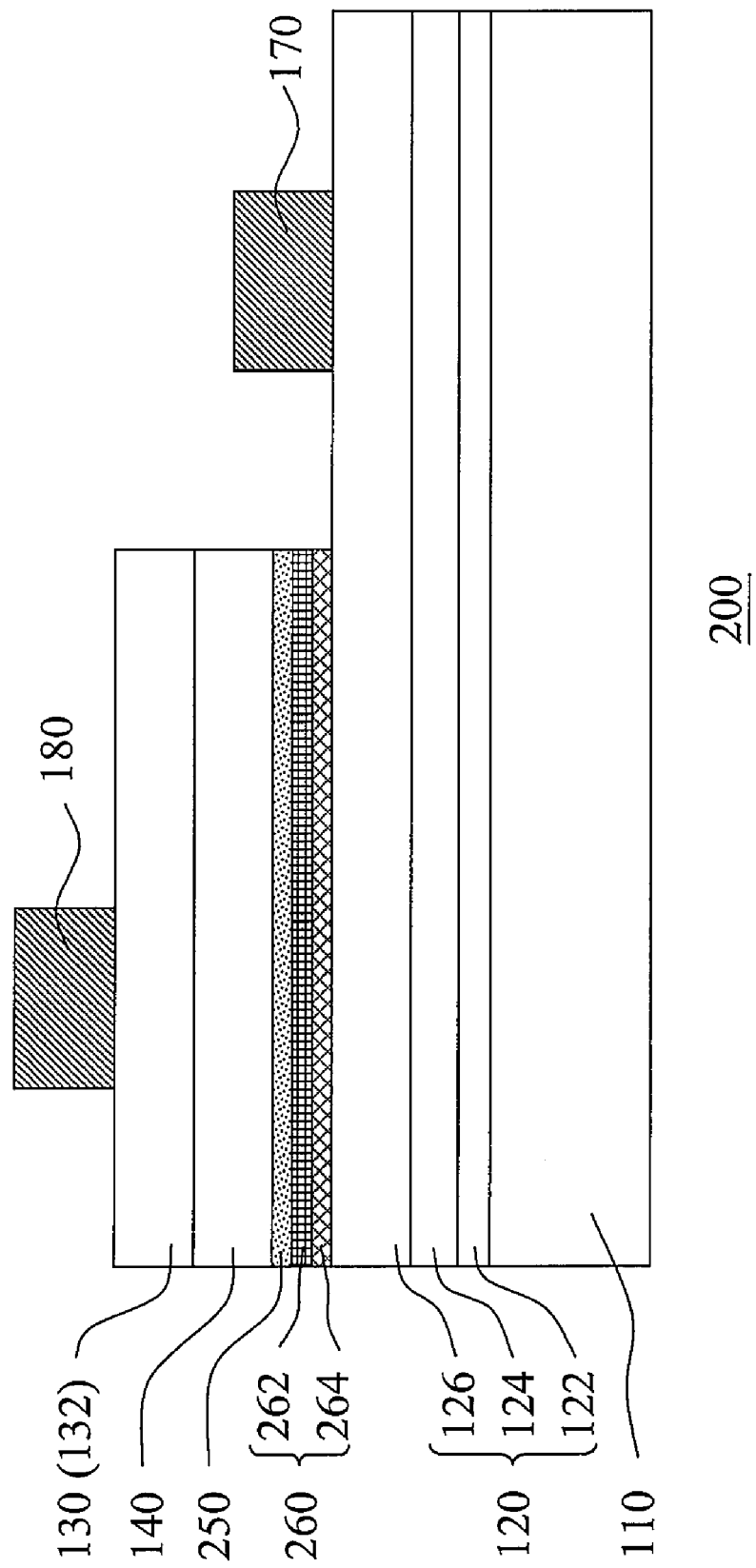
FIG. 2 is a cross-sectional schematic view of an LED chip according to a second embodiment of the present invention.

FIG. 2 is a cross-sectional view of the LED chip according to a second embodiment of the present invention. Referring to FIG. 2, the LED chip 200 of the second embodiment is similar to the LED chip 100 (shown in FIG. 1) of the first embodiment; the difference is that the disposition of the Indium-doped $Al_xGa_{1-x}N$ based material layer ($0 \leq x<1$) 250 and the tunneling junction layer 260 are different. In this embodiment, the Indium-doped $Al_xGa_{1-x}N$ based material layer 250 is disposed on the lower surface of the light emitting layer 140, and the tunneling junction layer 260 is disposed between the Indium-doped $Al_xGa_{1-x}N$ based material layer 250 and the fist type doped semiconductor layer 120. Also, the tunneling junction layer 260 comprises a first type $Al_xGa_{1-x}N$ based material layer ($0 \leq x<1$) 262 and a second type $Al_xGa_{1-x}N$ based material layer ($0 \leq x<1$) 264, wherein the first type $Al_xGa_{1-x}N$ based material layer 262 is disposed between the Indium-doped $Al_xGa_{1-x}N$ based material layer 250 and the second type $Al_xGa_{1-x}N$ based material layer 264.

Similar to the above described reasons, the Indium-doped $Al_xGa_{1-x}N$ based material layer 250 can reduce the lattice mismatch between the first type doped semiconductor layer 120 and the light emitting layer 140, so as to provide the LED chip 200 with a more planar surface. Additionally, the tunneling junction layer 260 can reduce the voltage drop between the first type doped semiconductor layer 120 and the light emitting layer 140, so as to provide the LED chip 200 with a lower operation voltage. Certainly, the undoped $Al_xGa_{1-x}N$ based material layer can also be used to replace the Indium-doped $Al_xGa_{1-x}N$ based material layer 250 so as to provide the LED chip 200 with a lower leakage current. It is to be mentioned that the tunneling junction layer 260 in this embodiment can also be used as a cladding layer to replace the above first type cladding layer that the electrical properties of the LED chip 200 can be improved.

It should be noted that, the number of the Indium-doped $Al_xGa_{1-x}N$ based material layers and of the tunneling junction layers are not limited in the present invention. For example, the LED chips 100, 200 of the first embodiment and the second embodiment can be combined in the present invention, such that the Indium-doped $Al_xGa_{1-x}N$ based material layer and the tunneling junction layer can be disposed between the light emitting layer and the first doped semiconductor layer, and disposed between the light emitting layer and the second doped semiconductor layer. Since this can be easily derived by those skilled in the art, it will not be depicted herein.

In addition, the first type $Al_xGa_{1-x}N$ based material layer is not limited to n-type $Al_xGa_{1-x}N$ based material layer, and the second type $Al_xGa_{1-x}N$ based material layer is not limited to p-type $Al_xGa_{1-x}N$ based material layer according to the present invention. The LEDs with other forms of the present invention will be illustrated through the other embodiments with reference to the drawings.

The Third and Fourth Embodiments

Figure 3:
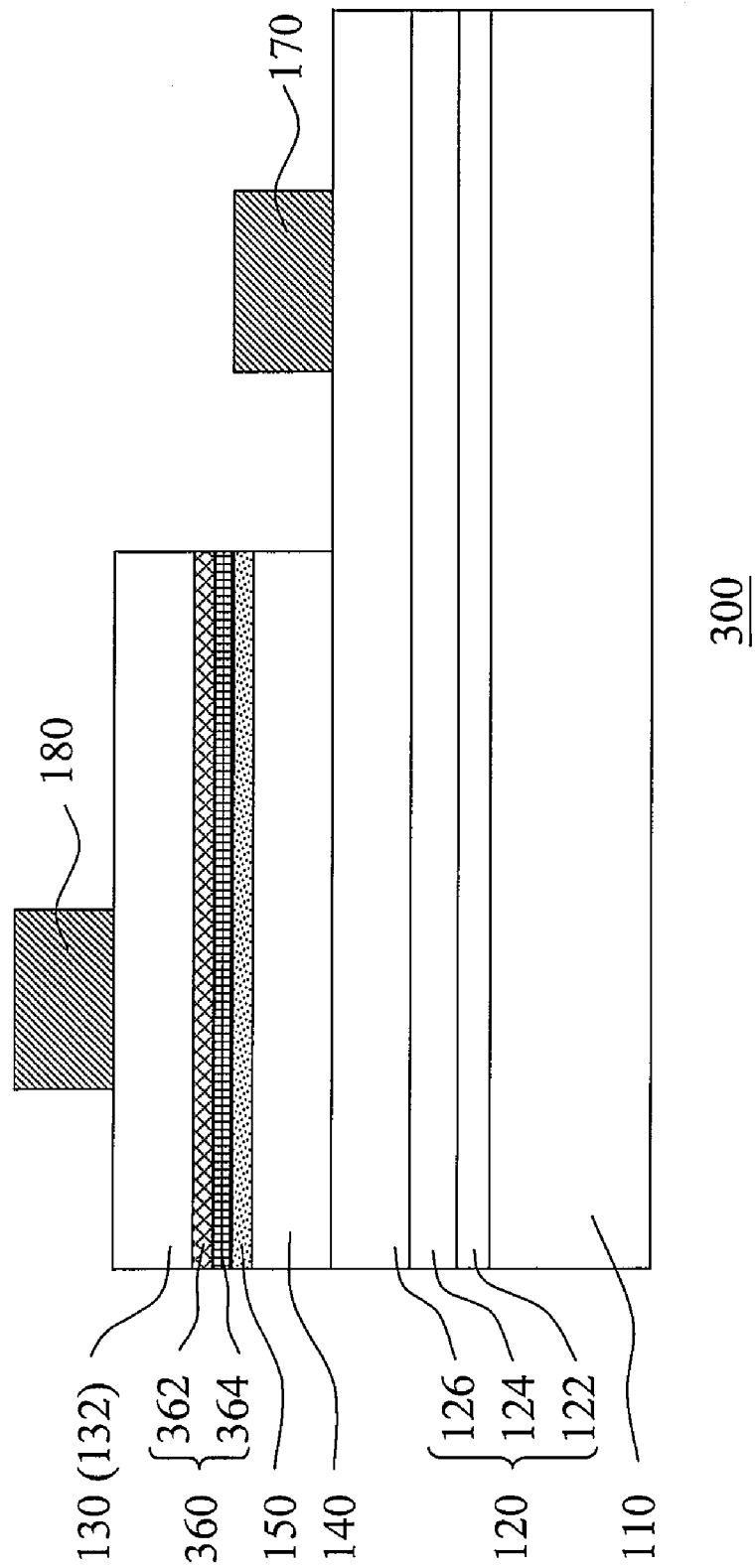
FIG. 3 is a cross-sectional schematic view of an LED chip according to a third embodiment of the present invention.
Figure 4:
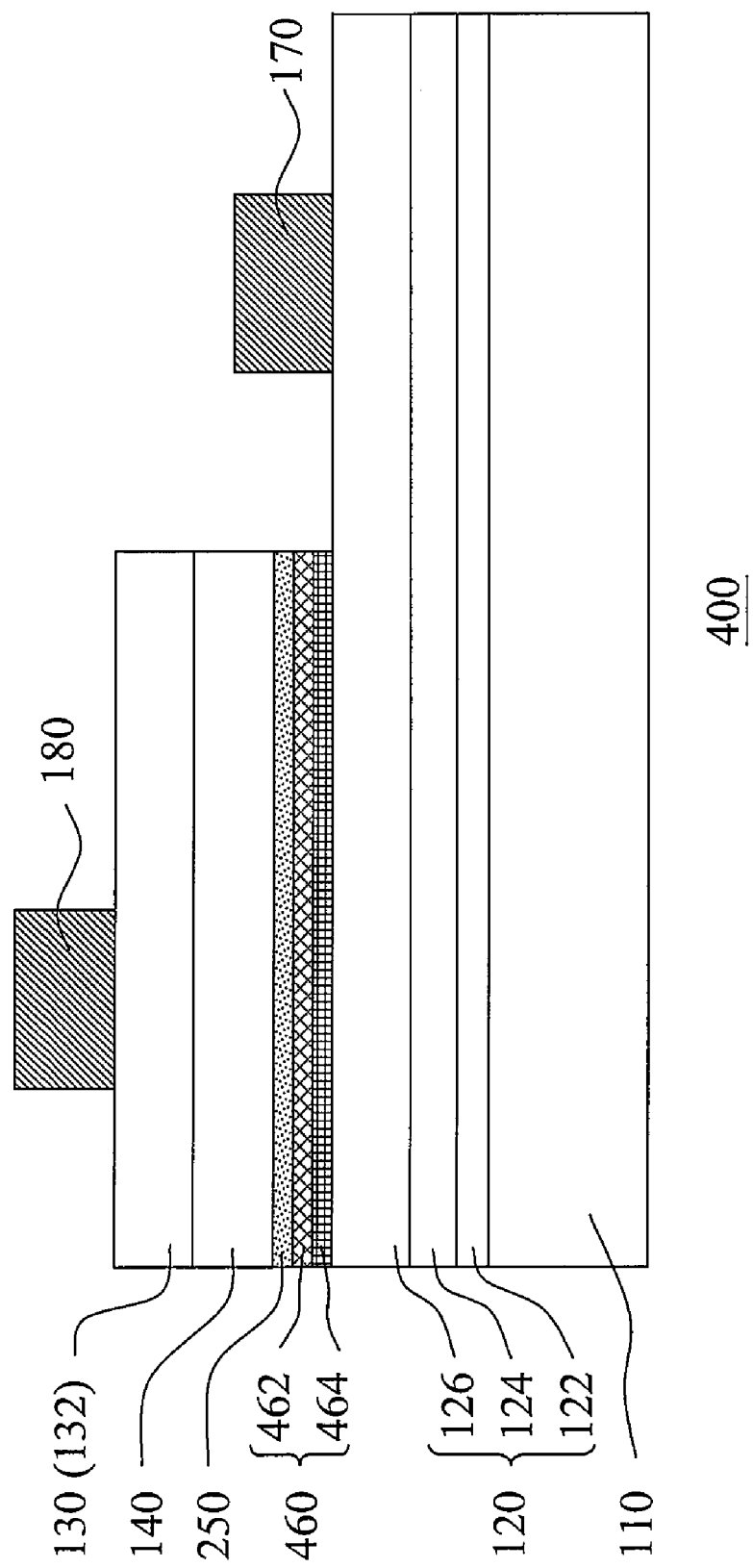
FIG. 4 is a cross-sectional schematic view of an LED chip according to a fourth embodiment of the present invention.

FIG. 3 is a cross-sectional view of the LED chip according to the third embodiment of the present invention, and FIG. 4 is a cross-sectional view of the LED chip according to a fourth embodiment of the present invention. Referring to FIG. 3, the LED chip 300 of the third embodiment is similar to the LED chip 100 (shown in FIG. 1) of the first embodiment; the difference is that the first type $Al_xGa_{1-x}N$ based material layer 362 of the tunneling junction layer 360 is a p-type $Al_xGa_{1-x}N$ based material layer, and the second type $Al_xGa_{1-x}N$ based material layer 364 is an n-type $Al_xGa_{1-x}N$ based material layer. Referring to FIG. 4, the LED chip 400 of the fourth embodiment is similar to the LED chip 200 of the second embodiment (shown in FIG. 2); the difference is that the first type $Al_xGa_{1-x}N$ based material layer 462 of the tunneling junction layer 460 is a p-type $Al_xGa_{1-x}N$ based material layer, and the second type $Al_xGa_{1-x}N$ based material layer 464 is an n-type $Al_xGa_{1-x}N$ based material layer.

Accordingly, referring to FIGS. 3 and 4, in these two embodiments, the first type $Al_xGa_{1-x}N$ based material layer can be Magnesium-doped, Indium-doped, or the combination thereof, and the second type $Al_xGa_{1-x}N$ based material layers 364, 464 can be Silicon-doped, Indium-doped, or the combination thereof. It should be noted that, especially when the first type $Al_xGa_{1-x}N$ based material layers 362, 462 are both Magnesium-doped and Indium-doped, and the second type $Al_xGa_{1-x}N$ based material layers 364, 464 are both Silicon-doped and Indium-doped, the LED chips 300, 400 can even have a lower operation voltage, respectively. Certainly, in the configurations of the two embodiments, the first type doped semiconductor layer 120 and the second type semiconductor layer 130 are required to be p-type $Al_xGa_{1-x}N$ based material layer and n-type $Al_xGa_{1-x}N$ based material layer, respectively.

It is to be mentioned that, the undoped $Al_xGa_{1-x}N$ based material layer can be used to replace the Indium-doped $Al_xGa_{1-x}N$ based material layers 150, 250 (shown in FIGS. 3 and 4) according to the present invention, so as to provide the LED chip 200 with lower leakage current. Additionally, the LED chips 300, 400 of the third embodiment and the fourth embodiment can be combined in the present invention, such that the Indium-doped $Al_xGa_{1-x}N$ based material layer and the tunneling junction layer can be disposed between the light emitting layer and the first doped semiconductor layer, and disposed between the light emitting layer and the second doped semiconductor layer. Since this can be easily derived by those skilled in the art, it will not be depicted herein.

As for 100, 200, 300, 400 of each of the above embodiment (shown in FIG. 1, FIG. 2, FIG. 3, and FIG. 4), the Indium-doped $Al_xGa_{1-x}N$ based material layer (or the undoped $Al_xGa_{1-x}N$ based material layer) and the tunneling junction layer are disposed between the light emitting layer and the first doped semiconductor layer, or disposed between the light emitting layer and the second doped semiconductor layer. However, the Indium-doped $Al_xGa_{1-x}N$ based material layer (or the undoped $Al_xGa_{1-x}N$ based material layer and the tunneling junction layer are not limited to be located at the above-described positions in the present invention. For example, the Indium-doped $Al_xGa_{1-x}N$ based material layer (or the undoped $Al_xGa_{1-x}N$ based material layer) and the tunneling junction layer can be disposed between the second electrode and the second type contact layer, or disposed between the second type contact layer and the second type cladding layer, or disposed between the first type cladding layer and the first type contact layer, etc., to provide the LED chip with preferred quality.

In summary, the LED chip of the present invention has the following advantages:

1. Since the Indium-doped $Al_xGa_{1-x}N$ based material layer is disposed, the LED chip has a more planar surface, and the dislocation defects of the LED chip generated during the process of the epitaxy are eliminated.

2. Since the undoped $Al_xGa_{1-x}N$ based material layer is disposed, the leakage current of the LED chip can be reduced, so as to promote the electrical properties.

3. Since the tunneling junction layer can be used to effectively reduce the voltage drop between the first/second type doped semiconductor layers and the light emitting layer, the LED chip has a lower operation voltage.

4. Since the first type $Al_xGa_{1-x}N$ based material layer is both Magnesium-doped and Indium-doped, and the second type $Al_xGa_{1-x}N$ based material layer is both Silicon-doped and Indium-doped, the operation voltage of the LED chip can be further reduced.

5. Since the tunneling junction layer has the property of a cladding layer, the LED chip obtains preferred electrical properties without the cladding layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode (LED) chip, comprising:
a substrate;
a first type doped semiconductor layer, disposed on the substrate;
a second type doped semiconductor layer, disposed over the first type doped semiconductor layer, wherein the first type doped semiconductor layer and the second type doped semiconductor layer are different conductive types of n-type and p-type;
a light emitting layer, disposed between the first type doped semiconductor layer and the second type doped semiconductor layer;
at least an Indium-doped $Al_xGa_{1-x}N$ based material layer ($0 \leq x < 1$), disposed on at least one surface of the light emitting layer;
at least a tunneling junction layer, disposed between the Indium-doped $Al_xGa_{1-x}N$ based material layer and the first type doped semiconductor layer and/or disposed between the Indium-doped $Al_xGa_{1-x}N$ based material layer and the second type doped semiconductor layer; wherein the Indium-doped $Al_xGa_{1-x}N$ based material layer and the tunneling junction layer are disposed at the same side of the light emitting layer, wherein a layer of the tunneling junction layer in contact with the Indium-doped $Al_xGa_{1-x}N$ based material layer is in different material to each other;
a first electrode, disposed on the first type doped semiconductor layer; and
a second electrode, disposed on the second type doped semiconductor layer,
wherein the tunneling junction layer comprises:
a first type $Al_xGa_{1-x}N$ based material layer ($0 \leq x < 1$); and
a second type $Al_xGa_{1-x}N$ based material layer ($0 \leq x < 1$), disposed on one surface of the first type $Al_xGa_{1-x}N$ based material layer.

2. The LED chip as claimed in claim 1, wherein the bandgap of the tunneling junction layer is greater than that of the light emitting layer.

3. The LED chip as claimed in claim 1, wherein the first type $Al_xGa_{1-x}N$ based material layer is Silicon-doped, Indium-doped, or the combination thereof, and the second type $Al_xGa_{1-x}N$ based material layer is Magnesium-doped, Indium-doped, or the combination thereof.

4. The LED chip as claimed in claim 3, wherein the Indium-doped $Al_xGa_{1-x}N$ based material layer is disposed on an upper surface of the light emitting layer, and the second type $Al_xGa_{1-x}N$ based material layer is disposed between the Indium-doped $Al_xGa_{1-x}N$ based material layer and the first type $Al_xGa_{1-x}N$ based material layer.

5. The LED chip as claimed in claim 3, wherein the Indium-doped $Al_xGa_{1-x}N$ material layer is disposed on a lower surface of the light emitting layer, and the first type $Al_xGa_{1-x}N$ based material layer is disposed between the Indium-doped $Al_xGa_{1-x}N$ based material layer and the second type $Al_xGa_{1-x}N$ based material layer.

6. The LED chip as claimed as claim 1, wherein the first type $Al_xGa_{1-x}N$ based material layer is Magnesium-doped, Indium-doped, or the combination thereof, and the second type $Al_xGa_{1-x}N$ based material layer is Silicon-doped, Indium-doped, or the combination thereof.

7. The LED chip as claimed in claim 6, wherein the Indium-doped $Al_xGa_{1-x}N$ based material layer is disposed on an upper surface of the light emitting layer, and the second type $Al_xGa_{1-x}N$ based material layer is disposed between the Indium-doped $Al_xGa_{1-x}N$ based material layer and the first type $Al_xGa_{1-x}N$ based material layer.

8. The LED chip as claimed in claim 6, wherein the Indium-doped $Al_xGa_{1-x}N$ based material layer is disposed on a lower surface of the light emitting layer, and the first type $Al_xGa_{1-x}N$ based material layer is disposed between the Indium-doped $Al_xGa_{1-x}N$ based material layer and the second type $Al_xGa_{1-x}N$ based material layer.

9. The LED chip as claimed in claim 1, wherein the first type doped semiconductor layer comprises:
a buffer layer, disposed on the substrate;
a nucleation layer, disposed on the buffer layer; and
a first type contact layer, disposed on the nucleation layer.

10. The LED chip as claimed in claim 1, wherein the second type doped semiconductor layer comprises a second type contact layer.

11. A light emitting diode (LED) chip, comprising:
a substrate;
a first type doped semiconductor layer, disposed on the substrate;
a second type doped semiconductor layer, disposed over the first type doped semiconductor layer, the first type doped semiconductor layer and the second type doped semiconductor layer are different conductive types of n-type and p-type;
a light emitting layer, disposed between the first type doped semiconductor layer and the second type doped semiconductor layer;
at least one undoped $Al_xGa_{1-x}N$ based material layer ($0 \leq x < 1$), disposed on at least one surface of the light emitting layer;
at least one tunneling junction layer, disposed between the undoped $Al_xGa_{1-x}N$ based material layer and the first type doped semiconductor layer and/or disposed between the undoped $Al_xGa_{1-x}N$ based material layer and the second type doped semiconductor layer; wherein the undoped $Al_xGa_{1-x}N$ based material layer and the tunneling junction layer are disposed at the same side of the light emitting layer, wherein a layer of the tunneling junction layer in contact with the undoped $Al_xGa_{1-x}N$ based material layer is in different material to each other, wherein the tunneling junction layer comprises:
a first type $Al_xGa_{1-x}N$ based material layer ($0 \leq x < 1$); and
a second type $Al_xGa_{1-x}N$ based material layer ($0 \leq x < 1$), disposed on one surface of the first type $Al_xGa_{1-x}N$ based material layer;
a first electrode, disposed on the first type doped semiconductor layer; and
a second electrode, disposed on the second type doped semiconductor layer.

12. The LED chip as claimed in claim 11, wherein the band-gap of the tunneling junction layer is greater than that of the light emitting layer.

13. The LED chip as claimed in claim 11, wherein the first type $Al_xGa_{1-x}N$ based material layer is Silicon-doped, Indium-doped, or the combination thereof, and the second type $Al_xGa_{1-x}N$ based material layer is Magnesium-doped, Indium-doped, or the combination thereof.

14. The LED chip as claimed in claim 13, wherein the undoped $Al_xGa_{1-x}N$ based material layer is disposed on an upper surface of the light emitting layer, and the second type $Al_xGa_{1-x}N$ based material layer is disposed between the undoped $Al_xGa_{1-x}N$ based material layer and the first type $Al_xGa_{1-x}N$ based material layer.

15. The LED chip as claimed in claim 13, wherein the undoped $Al_xGa_{1-x}N$ based material layer is disposed on a lower surface of the light emitting layer, and the first type $Al_xGa_{1-x}N$ based material layer is disposed between the undoped $Al_xGa_{1-x}N$ based material layer and the second type $Al_xGa_{1-x}N$ based material layer.

16. The LED chip as claimed in claim 11, wherein the first type $Al_xGa_{1-x}N$ based material layer is Magnesium-doped, Indium-doped, or the combination thereof, and the second type $Al_xGa_{1-x}N$ based material layer is Silicon-doped, Indium-doped, or the combination thereof.

17. The LED chip as claimed in claim 16, wherein the undoped $Al_xGa_{1-x}N$ based material layer is disposed on an upper surface of the light emitting layer, and the second type $Al_xGa_{1-x}N$ based material layer is disposed between the undoped $Al_xGa_{1-x}N$ based material layer and the first type $Al_xGa_{1-x}N$ based material layer.

18. The LED chip as claimed in claim 16, wherein the undoped $Al_xGa_{1-x}N$ based material layer is disposed on a lower surface of the light emitting layer, and the first type $Al_xGa_{1-x}N$ based material layer is disposed between the undoped $Al_xGa_{1-x}N$ based material layer and the second type $Al_xGa_{1-x}N$ based material layer.

19. The LED chip as claimed in claim 11, wherein the first type doped semiconductor layer comprises:
a buffer layer, disposed on the substrate;
a nucleation layer, disposed on the buffer layer; and
a first type contact layer, disposed on the nucleation layer.

20. The LED chip as claimed in claim 11, wherein the second type doped semiconductor layer comprises a second type contact layer.

* * * * *